(12) United States Patent
Yagisawa

(10) Patent No.: US 8,227,707 B2
(45) Date of Patent: Jul. 24, 2012

(54) COAXIAL CONNECTOR MOUNTED CIRCUIT BOARD

(75) Inventor: Takatoshi Yagisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 269 days.

(21) Appl. No.: 12/372,071

(22) Filed: Feb. 17, 2009

(65) Prior Publication Data

US 2009/0223708 A1    Sep. 10, 2009

(30) Foreign Application Priority Data

Mar. 10, 2008    (JP) .................................. 2008-059864

(51) Int. Cl.
*H05K 1/11*    (2006.01)
(52) U.S. Cl. ........................................ 174/262; 361/410
(58) Field of Classification Search .................. 174/262
See application file for complete search history.

(56) References Cited

U.S. PATENT DOCUMENTS

| | | | | | |
|---|---|---|---|---|---|
| 4,170,013 | A | * | 10/1979 | Black ..................... | 343/700 MS |
| 4,278,707 | A | * | 7/1981 | Biran ......................... | 427/96.6 |
| 5,244,395 | A | * | 9/1993 | DeSantis et al. ............... | 439/65 |
| 5,466,160 | A | * | 11/1995 | Ogura .............................. | 439/63 |
| 5,828,555 | A | * | 10/1998 | Itoh ............................... | 361/784 |
| 6,086,383 | A | * | 7/2000 | Fasano et al. ................... | 439/63 |
| 6,123,550 | A | * | 9/2000 | Burkert et al. .................. | 439/63 |
| 6,239,385 | B1 | * | 5/2001 | Schwiebert et al. .......... | 174/261 |
| 6,312,264 | B1 | * | 11/2001 | Franz et al. .................... | 439/76.1 |
| 6,682,354 | B2 | * | 1/2004 | Carson et al. .................... | 439/63 |
| 6,863,548 | B1 | * | 3/2005 | Coccioli et al. ............... | 439/101 |
| 7,042,318 | B2 | * | 5/2006 | Barnes et al. .................. | 333/260 |
| 7,088,489 | B2 | * | 8/2006 | Kiehne et al. .................. | 359/254 |
| 7,339,533 | B2 | * | 3/2008 | Kurashima et al. ............ | 343/702 |
| 7,545,243 | B2 | * | 6/2009 | Serban ........................... | 333/260 |
| 2007/0264872 | A1 | * | 11/2007 | Kuroda et al. ................. | 439/581 |
| 2008/0115967 | A1 | * | 5/2008 | Giboney et al. ............... | 174/351 |
| 2010/0176896 | A1 | * | 7/2010 | Payne .............................. | 333/33 |

FOREIGN PATENT DOCUMENTS

| | | |
|---|---|---|
| JP | 61-149403 | 9/1986 |
| JP | 2007-123950 | 5/2007 |
| JP | 2008-053351 | 3/2008 |

OTHER PUBLICATIONS

Alan M. Lyons et al., "Connector Interconnections to Transmission Lines for 40 G/bs Broadband Applications" IEEE 2002 Electronic Components and Technology Conference pp. 1021-1026, 2002 Issue, Aug. 7, 2002.
Japanese Office Action for corresponding Japanese Application 2008-059864; dated Feb. 28, 2012.

* cited by examiner

*Primary Examiner* — Xiaoliang Chen
*Assistant Examiner* — Nathan Milakovich
(74) *Attorney, Agent, or Firm* — Staas & Halsey LLP

(57) ABSTRACT

A circuit board has a multilayer substrate having a surface earth pattern and a signal line on a surface of the multilayer substrate and an inner earth pattern in the multilayer substrate. A connecting conductor pattern is arranged at an end of the inner earth pattern and on a side face of the multilayer substrate. The connecting conductor pattern electrically connects the surface earth pattern with the inner earth pattern. A connector has an inner conductor and an outer conductor, with the inner conductor electrically connected with the signal line, and the outer conductor electrically connected with the connecting conductor pattern.

2 Claims, 6 Drawing Sheets

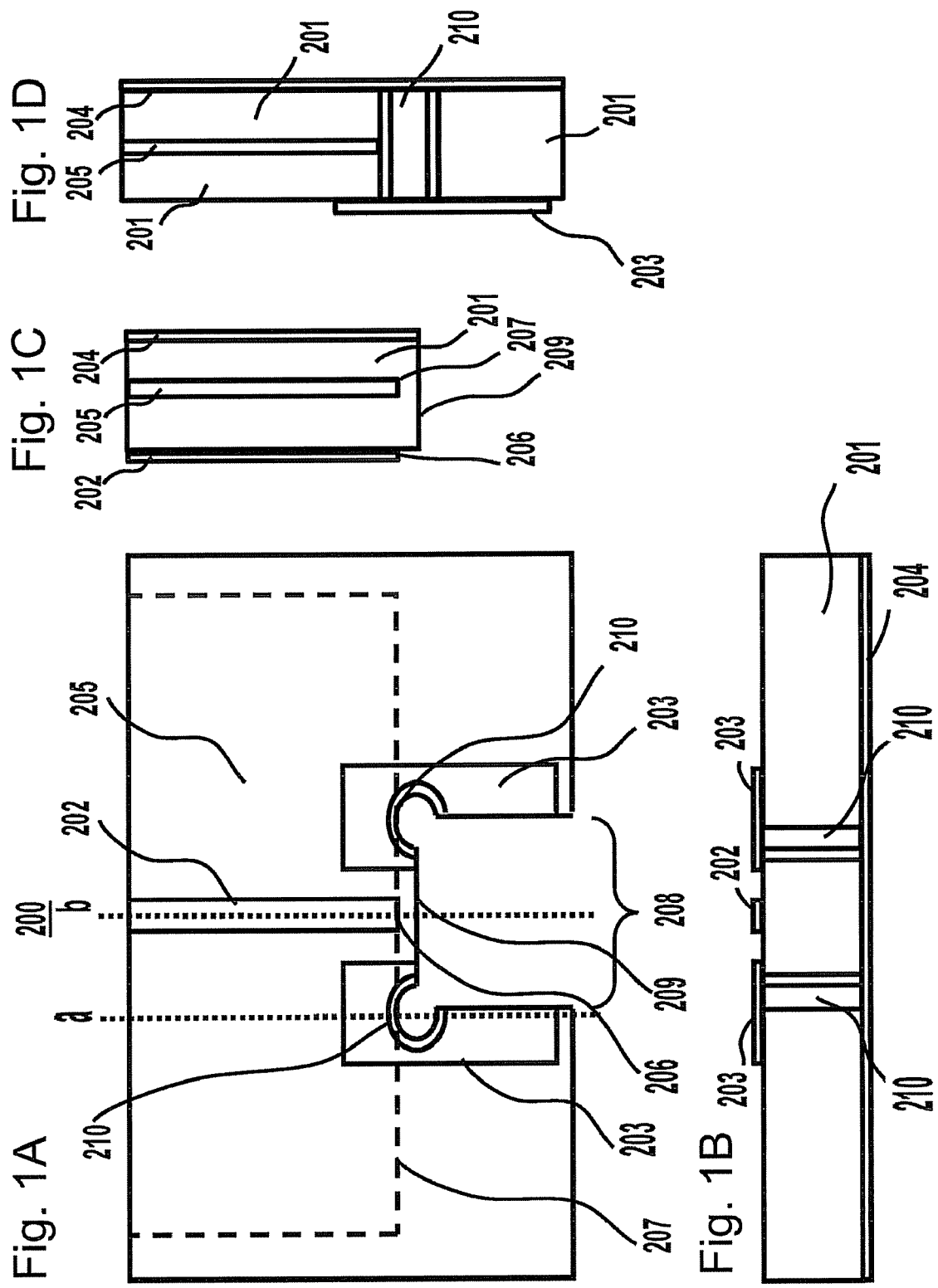

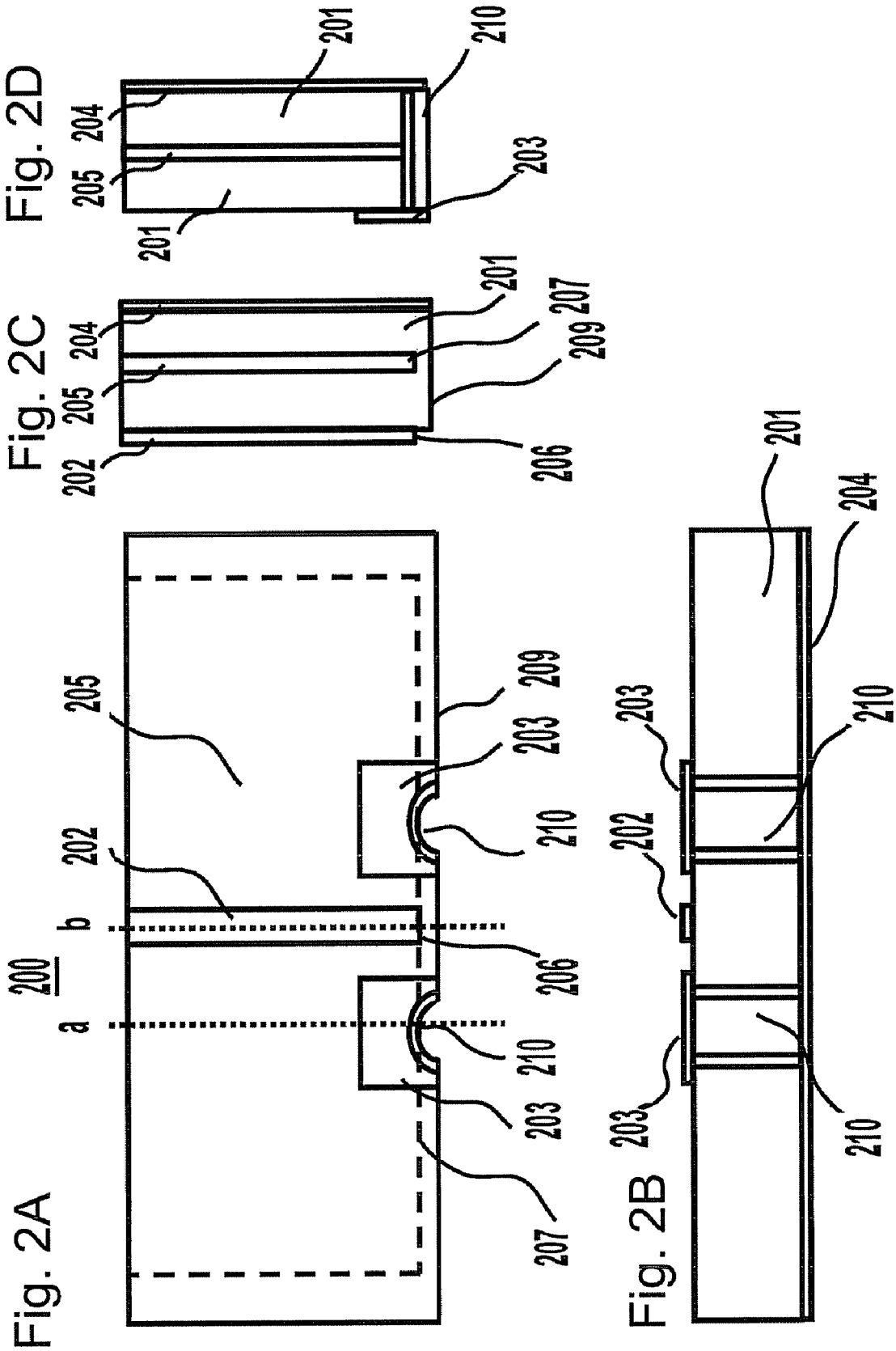

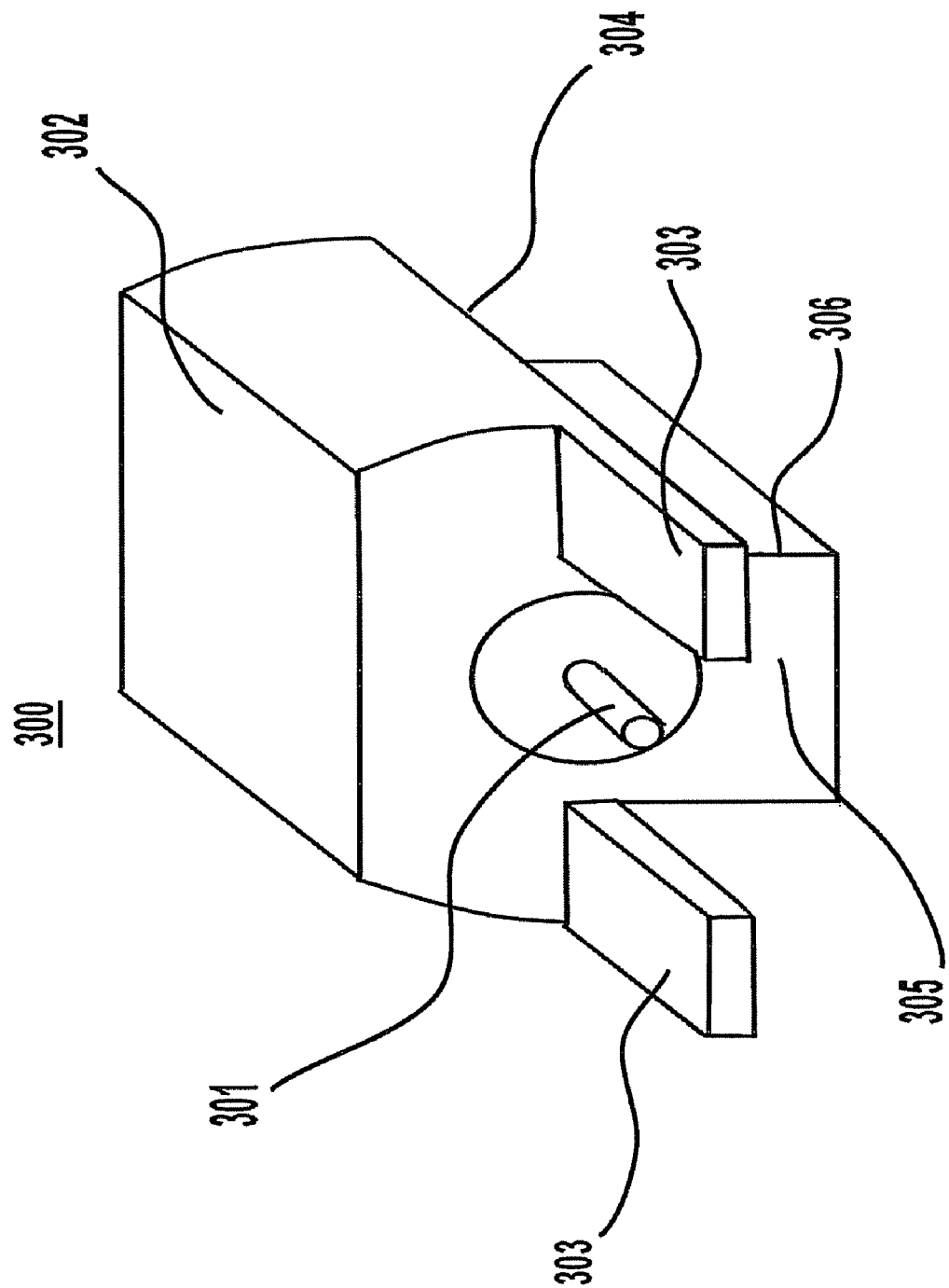

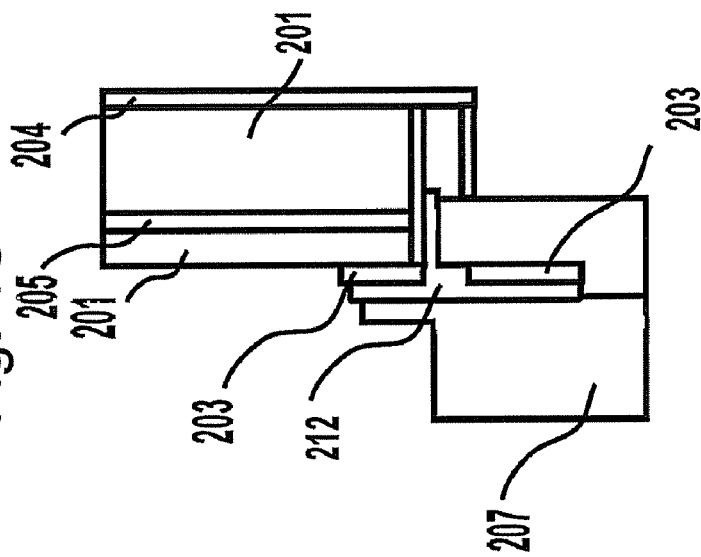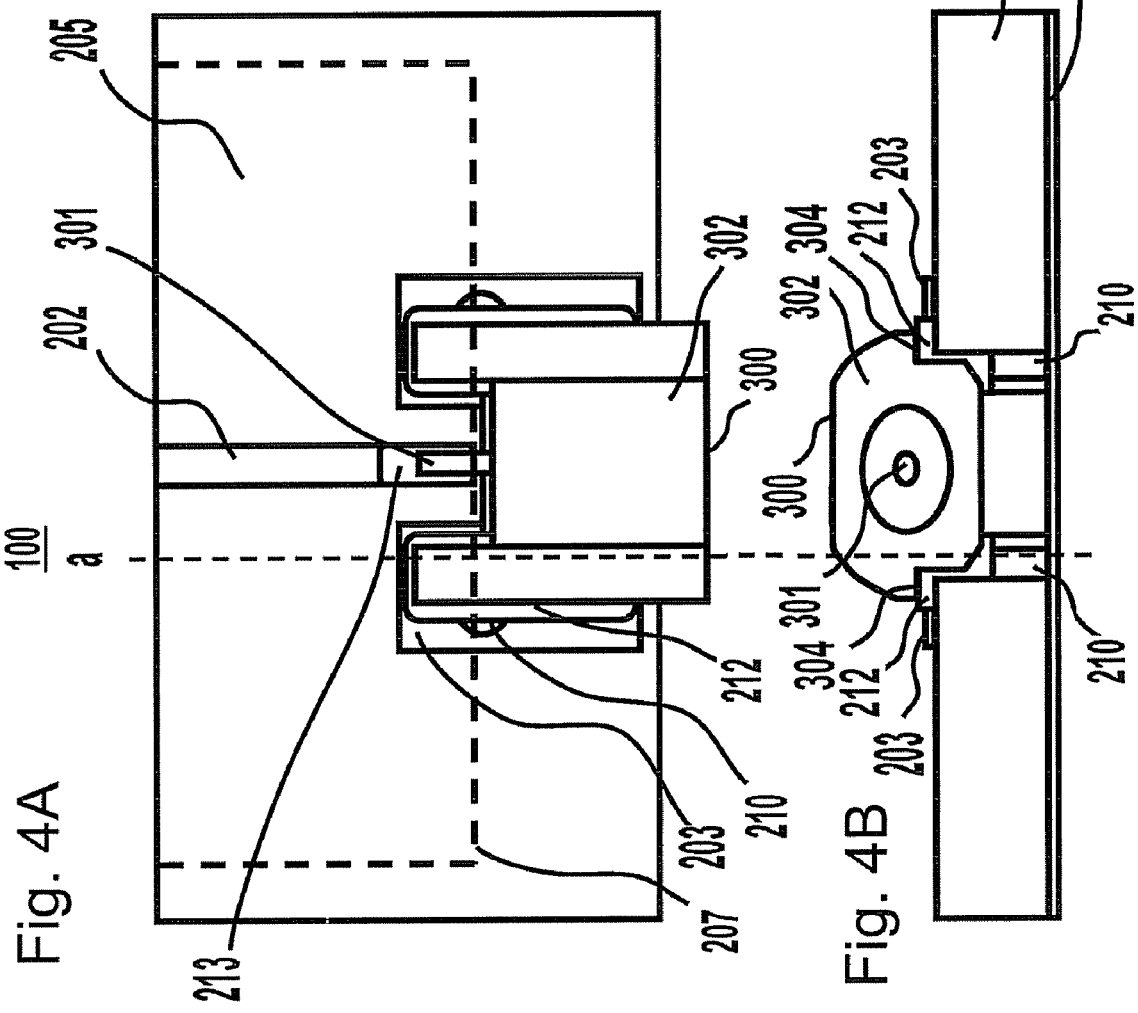

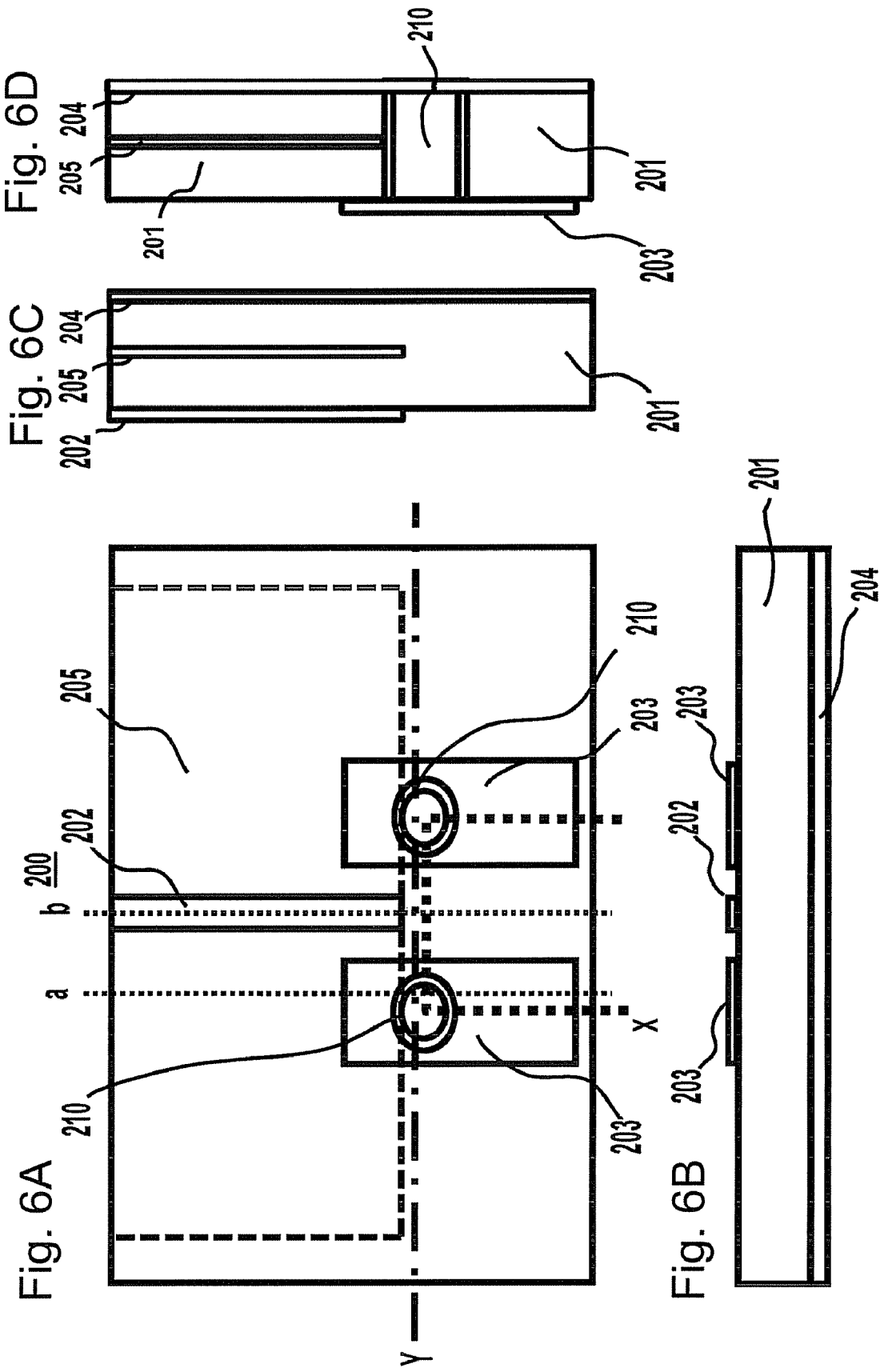

COAXIAL CONNECTOR MOUNTED CIRCUIT BOARD

CROSS-REFERENCE TO RELATED APPLICATION

This application is based upon and claims the benefit of priority of the prior Japanese Patent Application No. 2008-059864, filed on Mar. 10, 2008, the entire contents of which are incorporated herein by reference.

FIELD

The embodiments discussed herein are related to a coaxial connector mounted on a substrate.

BACKGROUND

Electric signals used in a high-speed optical transmitting and receiving apparatus are high-speed signals of 40 Gb/s or the like. The high-speed optical transmitting and receiving apparatus is comprised of a plurality of units. The connection between the units is connected by coaxial connectors. An example of the connection made by a coaxial connector is given below.

The unit is a printed circuit board. The printed circuit board including an earth pattern on a bottom face of the printed circuit board. The printed circuit board and an outside conductor (earth) of the coaxial connector are fixed to a metal package so that they are electrically connected (for example, refer to the Japanese Laid-open Patent Publication No. 2007-123950). The configuration of the units in the high-speed optical transmitting and receiving apparatus requires a metal package, which results in an additional cost and space for the metal package, which makes it impossible to miniaturize the configuration.

For devices used in a high-speed optical transmitting and receiving apparatus of 40 Gb/s or the like, developments for making surface-mounted type coaxial connectors which are directly connected with a transmission line (high-speed signal line) on a printed circuit board have advanced. By means of the configuration between the inside conductor and the outside conductor these coaxial connectors make the characteristic impedance constant, hence preventing deterioration of high-frequency characteristic (for example, refer to the Alan M. Lyons et al, Connector Interconnections to Transmission Lines For 40 Gb/s Broadband Applications, 2002 Electronic Components and Technology Conference, pp. 1021-1026, 2002). With the development of the surface-mounted type coaxial connectors, connection between surface-mounted connectors and printed circuit boards is being reviewed.

A printed circuit board in a high-speed optical transmitting and receiving apparatus of 40 Gb/s or the like is multifunctional. Such a multi-functioned printed circuit board is provided with a multilayer wiring substrate having therein a plurality of wiring layers. The multilayer wiring substrate includes a signal line on the top surface of the printed circuit board and a plurality of wiring layers inside the printed circuit board. The thickness of the wiring in the printed circuit board is generally about several μm to ten and several μm. To keep the characteristic impedance constant and to prevent the deterioration of a high-frequency characteristic, the signal line on the multilayer wiring substrate is generally configured with an earth pattern as a microstrip line corresponding to a high-frequency characteristic. When a microstrip line is configured with a multilayer wiring substrate, an earth pattern is arranged in the substrate in the relation with the signal line and the earth pattern.

At the connection portion of a transmission line and a coaxial connector, by using a via hole connected with an earth pattern on the bottom side surface (inside, in this case) of a microstrip line, it is generally the case that the earth pattern is pulled out onto the printed circuit board surface by the via hole in such a manner as to form a grounded coplanar configuration. At the grounded coplanar portion, a signal line formed on a printed circuit board top surface, and the earth pattern on the top surface are connected with solder with an inside conductor and an outside conductor of the coaxial connector, respectively.

As described in the Alan M. Lyons et al, to prevent deterioration of a high-frequency characteristic of 30 GHz or more, it is furthermore necessary to make a connection with the outside conductor of the coaxial connector not through the via hole of the earth pattern on the bottom face (inside, in this case) of the grounded coplanar waveguide.

However, to make direct connection of the inside earth pattern of the multilayer earth pattern with the outside conductor of the coaxial connector, it is not possible to make a connection with the outside conductor of the coaxial connector by using solder even if the inside earth pattern is exposed from the lateral face of a multilayer wiring circuit board, because the inside earth pattern is no more than ten and several micro meter (μm) thick. Furthermore, the inside earth pattern exposed from the end of the printed circuit board is located internally between the coaxial connector and the end of the multilayer wiring circuit board. Therefore, it is impossible to connect the outside conductor of the coaxial connector by using solder.

Furthermore, to expose the inside earth pattern of the multilayer wiring circuit board on the lateral face thereof, it is necessary to cut out a portion of the multilayer wiring circuit board at a position where the inside earth pattern is to be exposed. However, when a portion of the multilayer wiring circuit board is cut out, wiring in the multilayer wiring circuit board may become plasticity (the meaning of the plasticity including a tactile or malleable) deformed due to the cutting on its cut top surface. Such plasticity deformed wire may be in touch with another wiring layer. It is therefore problematic to cut the multilayer wiring circuit board.

SUMMARY

According to an aspect of the embodiment a circuit board has a multilayer substrate having a surface earth pattern and signal line on a surface of the multilayer substrate and an inner earth pattern in the multilayer substrate; a connecting conductor pattern arranged at an end of the inner earth pattern and an side face of the multilayer substrate, the connecting conductor pattern electricity connecting with the surface earth pattern with the inner earth pattern; and a connector having an inside conductor and an outside conductor, the inside conductor electrically connected with the signal line, the outside conductor electrically connected with the connecting conductor pattern.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIGS. 1A-1D illustrate the configuration of a multilayer wiring circuit board according to an embodiment of the present invention.

FIGS. 2A-2D illustrate the configuration of a multilayer wiring circuit board according to an embodiment of the present invention.

FIG. 3 illustrates the configuration of a surface-mountable coaxial connector according to an embodiment of the present invention.

FIGS. 4A-4C illustrate a coaxial connector-mounted printed circuit board.

FIGS. 6A-6D are a diagram explaining the manufacturing method of a multilayer wiring circuit board according to an embodiment of the present invention.

DESCRIPTION OF EMBODIMENTS

Figure 5:
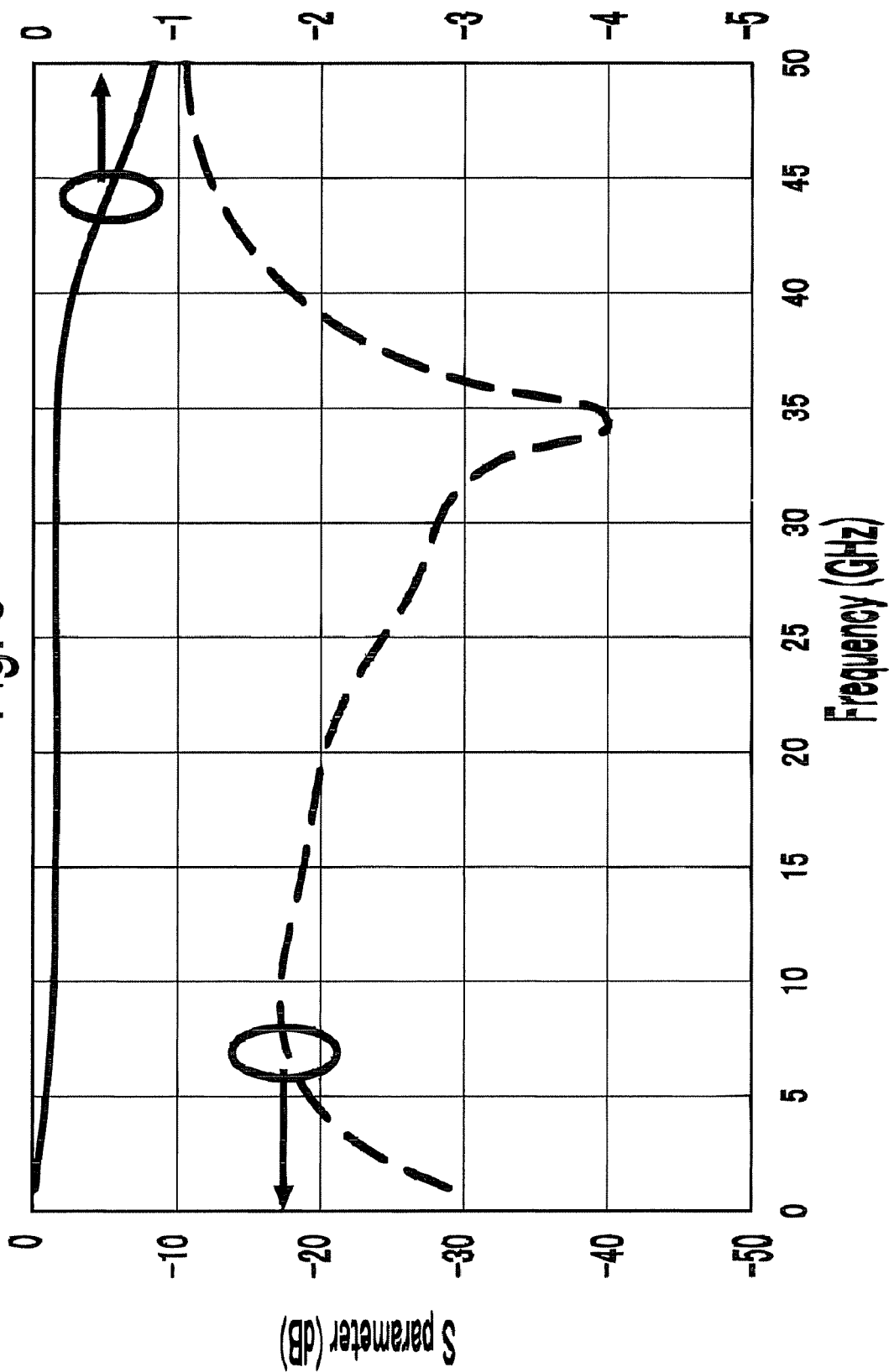
FIG. 5 is a diagram for explaining the characteristics of the configuration of FIGS. 4A-4C.

With reference to the drawings, embodiments will be explained below.

A coaxial connector-mounted printed circuit board, which mounts a surface mounted coaxial connector has a multilayer wiring substrate and a coaxial connector.

Multilayer Wiring Substrate

With reference to FIGS. 1A-1D and 2A-2D, a configuration of the multilayer wiring circuit board will be explained below.

FIG. 1A illustrates a top view of a multilayer wiring circuit board 200. FIG. 1B illustrates a side view of the multilayer wiring circuit board 200. FIG. 1C illustrates a sectional view of the multilayer wiring circuit board 200 taken along a dotted line "b" illustrated in FIG. 1A. FIG. 1D is a sectional view of the multilayer wiring circuit board 200 taken along a dotted line "a" illustrated in FIG. 1A.

The multilayer wiring circuit board 200 has a top surface, bottom face and lateral face. The multilayer wiring circuit board 200 has a substrate 201 made of dielectric material, and has wiring or a conductor pattern on the top surface, bottom face and inside thereof. The relation between the wire and the conductor pattern is given below.

A signal line 202 and a top surface earth pattern 203 are provided on the top surface of the multilayer wiring circuit board 200. The signal line 202, inside earth pattern 205 and top surface earth pattern 203 are conductors of metal.

Inside the multilayer wiring circuit board 200, namely, between the top surface and bottom face of the multilayer wiring circuit board 200, an inside earth pattern 205 is provided. The inside earth pattern 205 is the conductor of metal having thickness of approximately 18 µm.

On the bottom face of the multilayer wiring circuit board 200, a bottom face earth pattern 204 is provided. The bottom face earth pattern 204 is a metallic conductor. The bottom face earth pattern 204 is provided over the whole area of the bottom face of the multilayer wiring circuit board 200, but the bottom face earth pattern 204 may be provided on a portion of the connecting conductor pattern or may be omitted.

The signal line 202 and the inside earth pattern 205 form a microstrip line. The microstrip line configuration makes it possible to keep the characteristic impedance constant by means of the signal line 202 and the inside earth pattern 205. This configuration is made in order to transmit high-speed electric signals of 40 Gb/s or the like, which are used in a high-speed optical transmitting and receiving apparatus. The end 206 of the signal line 202 and the end 207 of the inside earth pattern 205 are formed more internally than the lateral face of the multilayer wiring circuit board 200 (refer to FIG. 1C). That is, the end 207 of the inside earth pattern 205 is not exposed from the lateral face 209 of the multilayer wiring circuit board 200. Likewise, the end 206 of the signal line 202 is not in contact with the lateral face of the multilayer wiring circuit board 200. That is, the coaxial connector arrangement space 208 is formed by cutting out a portion of the multilayer wiring circuit board 200 at a position where the end 206 is not in contact with the end 207. The reason to make such configuration is to prevent contact of the signal line 202 with the metal of the inside earth pattern 205, due to plastic deformation. If contact between the patterns due to plastic deformation is not problematic, the end 206 of the signal line 202 and the end 207 of the inside earth pattern 205 may be in contact with the lateral face of the multilayer wiring circuit board 200.

The multilayer wiring circuit board 200 is provided with a connecting conductor pattern 210 on the lateral face 209 thereof. With reference to FIG. 1B and FIG. 1D, the connecting conductor pattern 210 is electrically and physically connected with the end 207 of the inside earth pattern 205. Furthermore, the connecting conductor pattern 210 is electrically and physically connected with the top surface earth pattern 203. The connecting conductor pattern 210 is electrically and physically connected with the bottom face earth pattern 204 to reinforce the earth. FIG. 1A and FIG. 1B illustrates two connecting conductor patterns 210.

To configure the coaxial connector arrangement space 208, the connecting conductor pattern 210 is formed by cutting out a portion of the multilayer wiring circuit board 200 from the top surface to bottom face thereof to make a via hole pierced from the top surface to bottom face thereof. The via hole becomes notched via hole so as to cut out the via hole. When connecting a coaxial connector with the multilayer wiring circuit board 200 by using solder, the diameter of an opening viewed from the top view of the via hole has such a size as to allow a portion cut out for the via hole to be filled with solder, through positions extending from the top surface earth pattern 203 to the inside earth pattern of the multilayer wiring circuit board 200.

Connection between the connecting conductor pattern 210 and bottom face earth pattern 204 is made to reinforce the high-frequency characteristic and earth. Hence, such connection is not always required when the high-frequency characteristic is satisfactory due to the microstrip line configuration. Above description is made of a configuration in which a connecting conductor pattern 210 is pierced from the top surface to bottom face thereof. However, the connecting conductor pattern 210 may be formed by cutting out a via hole which permits connection at least from the printed circuit board top surface to the inside earth pattern 205.

In correspondence with an external shape of the coaxial connector, the coaxial connector arrangement space 208 is cut out in a rectangular form so that the extruded inside conductor of the coaxial connector will be in contact with and in alignment, on the same plane, with the signal line 202 of the microstrip line. In FIGS. 1A-1D, the coaxial connector arrangement space 208 is formed by cutting out a portion of the multilayer wiring circuit board 200 down to the bottom face thereof, but may be cut out so that the inside conductor will be in contact with and in alignment, on the same plane, with the signal line 202. That is, the coaxial connector arrangement space 208 may be configured to be cut down halfway through the multilayer wiring circuit board 200.

The top surface earth pattern 203 is formed on the top surface of the multilayer wiring circuit board 200 so that it is in contact with the connecting conductor pattern 210 in which a via hole is cut out. The top surface earth pattern 203 extends to the inside of the printed circuit board, from the lateral face 209 opposite the end 206 of the signal line 202. Furthermore, two top surface earth patterns 203 are formed in such a manner as to seal in the end 206 of the signal line 202. The two top surface earth patterns 203 are each provided with a connecting conductor pattern 210. The top surface earth pattern 203 may be formed in such a manner that only the connecting conductor pattern 210 will be a portion exposed to the top surface of the multilayer wiring circuit board 200. The top surface earth pattern 203 is provided adjacently to the coaxial connector arrangement space 208. Between the top surface earth pattern 203 and bottom face earth pattern 204, a plurality of via holes may be provided, apart from the connecting conductor pattern 210.

FIG. 2A illustrates a top view of a multilayer wiring circuit board 200. FIG. 2B illustrates a side view of a multilayer wiring circuit board 200. FIG. 2C illustrates a sectional view of a multilayer wiring circuit board 200 taken along a dotted line "b" illustrated in FIG. 2A. FIG. 2D is a sectional view of a multilayer wiring circuit board 200 taken along a dotted line "a" illustrated in FIG. 2A. In FIG. 2A-2D, the same members as those in FIG. 1A-1D are indicated with the same numbers, and explanation thereof is omitted.

FIGS. 2A-2D are different from FIG. 1A-1D in terms of the configuration of the cut-out portion. While in FIGS. 1A-1D, the coaxial connector arrangement space 208 is cut out in a rectangular form, in FIG. 2, at a position where the connecting conductor pattern 210 is located, a portion of the multilayer wiring circuit board 200 is cut out in such a manner that the inside earth pattern 205 and the signal line 202 are not exposed. In the other points, FIGS. 2A-2D are substantially same as FIG. 1A-1D.

Coaxial Connector

FIG. 3 illustrates the configuration of a surface-mountable coaxial connector of an embodiment.

The coaxial connector 300 is provided with an inside conductor 301 and an outside conductor 302. As the inside conductor 301 is projected from the outside conductor so as to be connected with a signal line 202 by the use of solder, for example.

The outside conductor 302 is provided with a stepped portion 304 to be connected by solder with the connecting conductor pattern 210 and inside earth pattern 205. At the lateral face 305 to where the inside conductor 301 being projected from the outside conductor 302 is provided with an outside conductor extruded portions 303. The inside conductor 301 is arranged between the outside conductor extruded portions 303.

The stepped portion 304 is stepped in such a manner that the inside conductor of the coaxial connector will be in contact, on the same plane, with the signal line 202 of the multilayer wiring circuit board 200.

The configuration of FIG. 3 illustrates a general surface-mounted coaxial connector, and the shape of the coaxial connector 300 is not limited to the configuration of FIG. 3.

Coaxial Connector Mounted Printed Circuit Board

FIGS. 4A-4C illustrate a coaxial connector-mounted printed circuit board 100. Specifically, FIGS. 4A-4C illustrate a configuration in which a coaxial connector of FIG. 3 is mounted on a multilayer wiring circuit board 200 of FIGS. 1A-1D. FIG. 4A illustrates a top view of a coaxial connector-mounted printed circuit board 100. FIG. 4B illustrates a side view of the coaxial connector-mounted printed circuit board 100. FIG. 4C illustrates a sectional view of the multilayer wiring circuit board 200 taken along a dotted line a, illustrated in FIG. 4A. The members in FIGS. 4A-4C, which are the same as those in FIGS. 1A-1D and FIG. 3, have the same numbers as in FIGS. 1A-1D and FIG. 3, and explanation thereof is omitted.

The coaxial connector 300 is located in the coaxial connector arrangement space 208 of the multilayer wiring circuit board 200. The stepped portion 304 at the outside conductor 302 of the coaxial connector 300 is fitted into the coaxial connector arrangement space 208. The inside conductor 301 of the coaxial connector 300 is located in alignment with the signal line 202 of the multilayer wiring circuit board 200. The inside conductor 301 and signal line 202 are electrically and physically connected to each other with solder 213.

A corner 306 formed by the stepped portion 304 and the lateral face 305 on the outside conductor 302 of the coaxial connector 300 is located so that it will fit into a cut-out portion in the connecting conductor pattern 210 of the multilayer wiring circuit board 200. The connecting conductor pattern 210 and the outside conductor 302 are electrically and physically connected to each other with solder 212.

The solder 212 is provided to the bottom face of the outside conductor 302 from the top surface earth pattern 203, the stepped portion 304 of the outside conductor 302 and the project potion of the outside conductor 303 through an interstice between the connecting conductor pattern 210 and the outside conductor 302.

Between the outside conductor 302 and the connecting conductor pattern 210, the solder 212 is provided from a position where the inside earth pattern 205 is located to the bottom face of the multilayer wiring circuit board 200.

Characteristics of Coaxial Connector Mounted Circuit Board

FIG. 5 illustrates an example of a simulation for explaining the characteristics of the configuration of FIG. 4. The abscissa indicates frequency, the left ordinate indicates the amount of reflection, and the right ordinate indicates the amount of transmission. The dotted line indicates a reflection characteristic and the solid line indicates a transmission characteristic. With reference to the transmission characteristic indicated by a solid line, the transmission attenuation is approximately 0.4 dB at a frequency of 40 GHz. Furthermore, at 50 GHz, the total supposed transmission was approximately 0.8 dB. In the configuration of FIG. 3, though not illustrated, when connection was made only between the top surface earth pattern 203 and the outside conductor 302, the loss was increased by more than −3 dB around 35 GHz, and the high-frequency characteristic deteriorated markedly.

Manufacturing Method of the Coaxial Connector Mounted Printed Circuit Board

Description will be made below of a manufacturing method of a coaxial connector-mounted printed circuit board provided with a printed circuit board which mounts a coaxial connector. FIG. 6 illustrates a multilayer wiring circuit board 100 from which a connecting conductor pattern 210 has not yet been cut out. Numerals in FIG. 6A-6D that are the same as those in FIGS. 1A-1D indicate the same members in FIGS. 1A-1D. The description thereof is omitted.

The multilayer wiring circuit board 200 of an initial stage is provided with a signal line 202 and a top surface earth pattern 203 on the top surface thereof, with an inside earth pattern 205 on the inside thereof, and with a bottom face earth pattern 204 on the bottom face thereof.

Next, the multilayer wiring circuit board 200 is provided with a via hole which electrically and physically connects an inside earth pattern with a top surface earth pattern. This state is illustrated in FIGS. 6A-6D.

Next, a portion of the multilayer wiring circuit board 200 is cut out in such a manner that the inside of a via hole is exposed at the lateral face of the multilayer wiring circuit board 200. In the case of FIGS. 1A-1D, a portion of the multilayer wiring circuit board 200 is cut out in a rectangular form, as indicated by a dotted line X. Furthermore, in the case of FIGS. 2A-2D, a portion of the multilayer wiring circuit board 200 is cut out as indicated in a chain line Y.

Next, the inside conductor 301 of the coaxial connector 300 is electrically and physically connected with the signal line 202 with solder.

The outside conductor 302 of the coaxial connector 300 is connected through the connecting conductor pattern 210 and solder.

The aforementioned embodiments are given as examples, and the present invention is not limited to the aforementioned embodiments.

By the use of the configuration of an embodiments, with the high-frequency characteristic being prevented from deteriorating, it is possible to connect an inside earth pattern of a multilayer wiring circuit board with an outside conductor of a coaxial connector.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A circuit board comprising:
a multilayer substrate having a top surface, a top surface earth pattern on the top surface, a signal line on the top surface, an inside earth pattern in the multilayer substrate, a lateral surface at an outer periphery of the multilayer substrate, a connector arrangement space at the outer periphery, and a cut out via hole at the outer periphery, the lateral surface including a first portion defined by the cut out via hole and a second portion defined by the connector arrangement space, the inside earth pattern reaching the first portion and not reaching the second portion;
a connecting conductor pattern arranged at an end of the inside earth pattern and at the first portion of the lateral surface, the connecting conductor pattern electrically connecting the top surface earth pattern with the inside earth pattern; and
a connector arranged at the connector arrangement space and having an inside conductor and an outside conductor, the inside conductor electrically connected with the signal line, the outside conductor electrically connected with the connecting conductor pattern.

2. A method for manufacturing a circuit board, the method comprising:
preparing a multilayer substrate including a top surface earth pattern and a signal line on the top surface and an inside earth pattern in the multilayer substrate;
preparing a connector having an inside conductor and an outside conductor;
forming a via hole from the top surface earth pattern to the inside earth pattern in the multilayer substrate so that the inside earth pattern is exposed to the via hole;
forming a connecting conductor pattern in the via hole, the connecting conductor pattern electrically connecting the top surface earth pattern with the inside earth pattern;
cutting out the multilayer substrate to expose an inside of the via hole an outer periphery of the multilayer substrate so that a first portion of a lateral surface situated at the outer periphery of the multilayer substrate is defined by the via hole and to form a connector arrangement space at the outer periphery so that a second portion of the lateral surface is defined by the connector arrangement space and the inside earth pattern is not exposed to the arrangement space;
arranging the connector at the connector arrangement space;
electrically connecting the signal line and the inner conductor of the connector; and
electrically connecting the outer conductor of the connector and the inner earth pattern via the via hole and a solder.

* * * * *